United States Patent
Sasaki et al.

(10) Patent No.: US 9,502,230 B2
(45) Date of Patent: Nov. 22, 2016

(54) METHOD FOR PRODUCING SIC SUBSTRATE

(71) Applicant: SHOWA DENKO K.K., Tokyo (JP)

(72) Inventors: Yuzo Sasaki, Hikone (JP); Kenji Suzuki, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/648,730

(22) PCT Filed: Nov. 27, 2013

(86) PCT No.: PCT/JP2013/081897
§ 371 (c)(1),
(2) Date: Jun. 1, 2015

(87) PCT Pub. No.: WO2014/091929
PCT Pub. Date: Jun. 19, 2014

(65) Prior Publication Data
US 2015/0303050 A1 Oct. 22, 2015

(30) Foreign Application Priority Data

Dec. 12, 2012 (JP) .................................. 2012-271578

(51) Int. Cl.
*H01L 21/02* (2006.01)
*H01L 29/16* (2006.01)

(52) U.S. Cl.
CPC ... *H01L 21/02019* (2013.01); *H01L 21/02013* (2013.01); *H01L 21/02024* (2013.01); *H01L 29/1608* (2013.01)

(58) Field of Classification Search
CPC .................. H01L 21/02019; H01L 21/02013; H01L 21/02024; H01L 29/1608
See application file for complete search history.

(56) References Cited

U.S. PATENT DOCUMENTS

| | | |
|---|---|---|
| 2008/0050844 A1 | 2/2008 | Masuda |
| 2009/0011598 A1 | 1/2009 | Nagaya et al. |
| 2009/0072243 A1 | 3/2009 | Suda et al. |
| 2009/0095712 A1 | 4/2009 | Yamauchi et al. |
| 2009/0124060 A1 | 5/2009 | Nagaya et al. |
| 2010/0144149 A1 | 6/2010 | Ward et al. |
| 2011/0221039 A1 | 9/2011 | Singh et al. |
| 2011/0294403 A1* | 12/2011 | Koutake .............. B28D 5/0082 451/8 |

(Continued)

FOREIGN PATENT DOCUMENTS

| | | |
|---|---|---|
| JP | 2008-71857 A | 3/2008 |
| JP | 2009-10071 A | 1/2009 |
| JP | 2009-16602 A | 1/2009 |

(Continued)

OTHER PUBLICATIONS

Machined translation of JP 2009-283629.*

(Continued)

*Primary Examiner* — Duy Deo
(74) *Attorney, Agent, or Firm* — Sughrue Mion, PLLC

(57) ABSTRACT

A method of manufacturing a SiC substrate of the invention includes at least an oxide film-forming process of forming an oxide film (10) to cover a surface (1*a*) of the SiC substrate (1); and a planarization process of polishing the SiC substrate (1) from an oxide film side (10) in accordance with a CMP method so as to remove the oxide film (10), and of polishing the surface (1*a*) of the SiC substrate (1) to planarize the surface (1*a*).

6 Claims, 3 Drawing Sheets

(56) References Cited

U.S. PATENT DOCUMENTS

2012/0068195 A1* 3/2012 Harada ............... C30B 29/36
257/77
2013/0196513 A1 8/2013 Kubota et al.

FOREIGN PATENT DOCUMENTS

| JP | 2009-117782 A | 5/2009 |
|---|---|---|
| JP | 2009-123806 A | 6/2009 |
| JP | 2009-283629 A | 12/2009 |
| JP | 2011-103379 A | 5/2011 |
| JP | 2011-176243 A | 9/2011 |
| TW | 200710927 | 3/2007 |
| TW | 200722561 | 6/2007 |
| TW | 201030832 A1 | 8/2010 |
| TW | 201207903 A1 | 2/2012 |
| WO | 2011/118532 A1 | 9/2011 |

OTHER PUBLICATIONS

Notification of Opinion of Examination dated May 18, 2015 from the Intellectual Property Office of Taiwan in counterpart application No. 102144741.
International Search Report for PCT/JP2013/081897 dated Feb. 25, 2014.
Communication dated Aug. 9, 2016 from the Japanese Patent Office in counterpart Application No. 2012-271578.
Communication dated Aug. 17, 2016 from the State Intellectual Property Office of the P.R.C. in counterpart Application No. 201380064310.3.

* cited by examiner

METHOD FOR PRODUCING SIC SUBSTRATE

CROSS REFERENCE TO RELATED APPLICATIONS

This application is a National Stage of International Application No. PCT/JP2013/081897 filed Nov. 27, 2013, claiming priority based on Japanese Patent Application No. 2012-271578, filed Dec. 12, 2012, the contents of all of which are incorporated herein by reference.

TECHNICAL FIELD

The present invention relates to a method for producing a SiC substrate, and more particularly, to a method for producing a SiC substrate which includes a process of polishing a surface of a SiC substrate or a SiC substrate in which an epitaxial layer is laminated on a surface side thereof.

BACKGROUND ART

Silicon carbide (SiC) has the following characteristics. An insulation break-down electric field of SiC is larger than that of silicon (Si) by one digit, a band gap of SiC is as large as three times a band gap of Si, and thermal conductivity of SiC is as high as three times the thermal conductivity of Si. Accordingly, application to a power device, a high frequency device, a high-temperature operation device, and the like has been expected. According to this, recently, a SiC substrate has been used as a substrate of a semiconductor device.

For example, the above-described SiC substrate is manufactured from a SiC bulk single crystal ingot that is prepared by a sublimation method and the like. Typically, the SiC substrate is obtained by the following procedure. That is, the outer periphery of the ingot is processed to have a cylindrical shape, the ingot is sliced into a disk shape by using a wire saw and the like, and an outer peripheral portion of the sliced article is chamfered to be finished with a predetermined diameter. In addition, a grinding process is performed with respect to a surface of the disk-shaped SiC substrate in accordance with a mechanical grinding method so as to adjust unevenness and a degree of parallelization. Then, mechanochemical polishing such as a chemical mechanical polishing (CMP) method is performed with respect to the surface, and thus one surface or both surfaces are mirror-finished. The grinding and polishing with respect to the SiC substrate are performed for planarization of the surface of the SiC substrate, and the like in addition to removal of waviness or work strain which occurs due to the slicing.

The above-described CMP method is a polishing method including both a chemical operation and a mechanical operation, and thus it is possible to stably obtain a flat surface without damaging the SiC substrate. Accordingly, in a process of manufacturing a SiC semiconductor device and the like, the CMP method is widely employed as a method of planarizing waviness on a surface of the SiC substrate or unevenness on a wafer, in which an epitaxial layer is laminated on the surface of the SiC substrate, due to interconnection and the like.

In addition, a wafer in which the SiC substrate is used is manufactured by growing a SiC epitaxial film which becomes an active region of a SiC semiconductor device on the SiC substrate obtained in the above-described procedure by chemical vapor deposition (CVD). On the other hand, in a case of using the SiC substrate that is sliced from the SiC single crystal ingot in a state in which unevenness or waviness occurs on the surface, unevenness and the like also occur on a surface of an epitaxial layer that is formed on the surface of the SiC substrate. Accordingly, when manufacturing a wafer in which a SiC epitaxial film is grown on the SiC substrate, the surface of the SiC substrate is polished in advance by using the CMP method, and even after the growth of the SiC epitaxial film, a grinding process according to the mechanical grinding method, and finish polishing according to the CMP method are performed so as to planarize the substrate surface, that is, the wafer surface.

Here, in a case where the epitaxial layer is grown on the surface of the SiC substrate in a state in which waviness or work strain remains thereon, and a semiconductor element such as a transistor and a diode is formed on the epitaxial layer so as to manufacture a semiconductor device, it is difficult to obtain electrical characteristics which are expected from original excellent physical properties of SiC. Accordingly, the process of planarizing the surface of the SiC substrate as described above becomes a very important process.

Generally, as a process of removing the waviness or work strain on the surface of the SiC substrate, for example, it is effective to use a mechanical polishing method such as lap polishing. In addition, with regard to planarization of the surface, for example, polishing using diamond having a particle size of 1 μm or less, or grinding using a grinding stone with a high count of #10000 or greater is effective. In addition, as finish processing on the surface of the SiC substrate before growth of the SiC epitaxial film, or as finish processing of the wafer after the SiC epitaxial film is formed, polishing in accordance with the CMP method is generally performed so as to obtain surface roughness Ra of less than 0.1 μm.

A method of grinding the surface of the SiC substrate with the CMP method in the related art will be described with reference to FIGS. 6 and 7.

As illustrated in FIG. 6, a SiC substrate 100, whose surface is ground with the mechanical grinding method after being sliced, is mounted to a rotatable SiC substrate-supporting portion 201 that is provided to a CMP polisher 200. Then, the SiC substrate 100 is pressed to a polishing pad 202a that is attached to a surface of a rotary platen 202, and the SiC substrate-supporting portion 201 is rotated while supplying slurry 204 to an interface between the polishing pad 202a and the SiC substrate 100 from a slurry nozzle 203, thereby polishing a polishing surface (surface) 100a of the SiC substrate 100.

However, even when planarizing the SiC substrate 100 in accordance with the method of the related art, at an initial stage of a process of polishing the SiC substrate 100 with the polishing in accordance with the CMP method, as illustrated in FIG. 6, scratches 300 occur on the polishing surface 100a. This is because at the initial stage of the CMP polishing, the scratches 300 tend to occur on the substrate surface due to an operation of pressing the polishing surface 100a of the SiC substrate to the polishing pad 202a, and a rotating operation of the SiC substrate 100 that is mounted to the SiC substrate-supporting portion 201. Here, in a case of CMP polishing the SiC substrate 100, generally, an average particle size of colloidal silica that is used as slurry is approximately 0.2 μm to 0.5 μm, and from a relationship between the amount removed by the CMP polishing and remaining scratches, it is assumed that the depth of the scratches 300 is approximately 0.5 μm or less. In a case where the scratches 300 occur due to the CMP polishing, as illustrated in FIG. 7, even after the SiC substrate 100 is detached from the SiC substrate-supporting portion 201, the scratches 300 remain on the polishing surface 100a, and thus there is a problem in that a yield ratio decreases.

Here, with regard to an improvement in surface roughness that is an original object during polishing of the SiC substrate 100 with the CMP method, it is possible to accomplish the improvement in a polishing time of approximately 10 minutes. On the other hand, when the scratches 300 occur at an initial stage of the polishing in accordance with the CMP method, even though the improvement in the surface roughness is accomplished, a new additional process is necessary to remove the scratches which occur at an initial processing stage. Typically, during the polishing in accordance with the CMP method, a processing rate is slow in comparison to other methods, and thus in a case of performing the additional process as described above, a processing time that is taken to remove the scratches 300 is added in a unit of several hours, and thus there is a problem that the process time is lengthened.

As a method of polishing the surface of the SiC substrate in accordance with the CMP method, for example, the following technology is suggested. Specifically, a plurality of SiC substrates are mounted on a rotary table, and when the SiC substrates are subjected to the CMP polishing with a batch process, the thickness of the substrate before the polishing is adjusted after applying a liquid material to a surface opposite to the polishing surface of each of the SiC substrates, and the thickness of the respective SiC substrates is adjusted without occurrence of mechanical damage such as the scratches on the substrate surface (refer to PTL 1). According to the technology that is disclosed in PTL 1, the above-described method is employed, and thus the thickness of the plurality of substrates can be adjusted without the mechanical damage on the substrate, and thus it is possible to obtain an effect capable of suppressing a polishing amount from being different on each surface of the plurality of SiC substrates.

In addition, the following technology is also suggested. Specifically, the SiC substrate is suctioned and fixed onto a rotary table, and when the SiC substrate is subjected to grinding, a curable material is laminated in advance on both surfaces of the SiC substrate, and the above-described grinding is performed after curing the curable material (for example, refer to PTL 2). According to the technology that is disclosed in PTL 2, a curable layer composed of a curable material is provided on both surfaces of the SiC substrate, and thus substrate rigidity is increased. Accordingly, when the SiC substrate is suctioned and fixed to a rotary table during the subsequent grinding process, it is possible to suppress the occurrence of waviness on the SiC substrate, and thus it is possible to prevent the waviness from remaining on the SiC substrate after the grinding.

CITATION LIST

Patent Literature

[PTL 1] Japanese Unexamined Patent Application, First Publication No. 2009-10071
[PTL 2] Japanese Unexamined Patent Application, First Publication No. 2011-103379

SUMMARY OF INVENTION

Technical Problem

However, the technology disclosed in PTL 1 relates to a method in which the liquid material is applied to a surface opposite to the polishing surface of the SiC substrate in order to adjust the substrate thickness so as to make a polishing amount of the plurality of SiC substrate constant, but it is difficult to prevent the occurrence of the scratches on the polishing surface of the SiC substrate at an initial stage of the CMP polishing or the lengthening of the process time as described above.

In addition, the technology disclosed in PTL 2 relates a method of suppressing occurrence of the waviness when the SiC substrate is suctioned and fixed. However, as is the case with PTL 1, it is difficult to prevent the occurrence of the scratches on the polishing surface of the SiC substrate at an initial stage of the CMP polishing or the lengthening of the process time. In addition, in the method of PTL 2, there is a serious problem in that damage such as the scratches occurs on the substrate surface after processing both surfaces of the SiC substrate.

As described above, with regard to a technology of preventing the occurrence of the scratches on the polishing surface of the SiC substrate at an initial stage of the CMP polishing, and lengthening of the process time due to the process of removing the scratches, no suggestion is made in the related art.

The invention has been made in consideration of the above-described problem, and an object thereof is to provide a method of manufacturing a SiC substrate with excellent productivity and yield ratio which is capable of preventing the occurrence of scratches on a surface of a SiC substrate, and which is capable of planarizing the SiC substrate without lengthening the process time.

Solution to Problem

The present inventors made a thorough investigation so as to prevent the occurrence of scratches at an initial stage when polishing the surface of the SiC substrate with the CMP method as described above, and so as to prevent lengthening of the process time due to an additional process of removing the scratches. As a result, they found the following phenomenon. That is, particularly, immediately after initiation of the CMP polishing, the scratches and the like tend to occur on the surface of the substrate (wafer) due to cooperation between an operation of pressing the SiC substrate to a polishing pad, and an operation of initiating rotation. In addition, they considered that it is effective to form an oxide film, which functions as a protective film during polishing, in advance on the surface of the SiC substrate that is pressed to the polishing pad during initiation of the CMP polishing so as to prevent the scratches that occurred at an initial stage of the CMP polishing from remaining on the SiC substrate (wafer).

That is, when the oxide film is formed on the surface of the SiC substrate in advance before the CMP polishing, the oxide film is in a state of being pressed to the polishing pad at an initial stage of the CMP polishing. Accordingly, although scratches occur on the oxide film, the oxide film itself is removed by the CMP polishing. In addition, the present inventor obtained the following findings. Although the surface of the SiC substrate is exposed after the oxide film is removed, the pressure of pressing the SiC substrate to the polishing pad or the number of revolutions already became stable during a processing stage. Accordingly, scratches do not occur on the SiC substrate, and an additional process of removing the scratches is not necessary.

In addition, the present inventor obtained the following findings. In a case of using slurry with high selectivity with respect to the oxide film, in the CMP polishing, a polishing amount (polishing margin) of the surface of the SiC substrate after the oxide film is removed is minute. Accordingly, scratches do not occur due to the CMP polishing, and thus the surface of the SiC substrate can be planarized with high productivity and a high yield ratio. From the findings, the present inventors accomplished the invention.

That is, the invention provides the following configurations to solve the above-described problems.

(1) According to an aspect of the invention, a method of manufacturing a SiC substrate is provided which includes a process of polishing and planarizing a surface of the SiC substrate. The method includes at least: an oxide film-forming process of forming an oxide film to cover the surface of the SiC substrate; and a planarization process of polishing the SiC substrate from an oxide film side in accordance with a chemical mechanical polishing (CMP) method so as to remove the oxide film, and of polishing the surface of the SiC substrate to planarize the surface.

(2) In the method of manufacturing a SiC substrate according to (1), in the oxide film-forming process, the oxide film may be formed in a film thickness of 0.5 µm or greater.

(3) In the method of manufacturing a SiC substrate according to (1) or (2), in the oxide film-forming process, when forming the oxide film on the surface of the SiC substrate, a film-forming rate may be 0.15 (µm/hr) or greater.

(4) In the method of manufacturing a SiC substrate according to any one of (1) to (3), in the planarization process, when polishing the oxide film and the SiC substrate in accordance with the CMP method, a processing rate of the oxide film may be greater than a processing rate of the SiC substrate.

(5) In the method of manufacturing a SiC substrate according to any one of (1) to (4), in the planarization process, when polishing the oxide film and the SiC substrate in accordance with the CMP method, a ratio of the processing rate of the oxide film to the processing rate of the SiC substrate may be 10 to 1 or greater, and the processing rate of the SiC substrate may be 0.1 (µm/hr) or greater.

(6) In the method of manufacturing a SiC substrate according to any one of (1) to (5), the SiC substrate may be a SiC substrate in which an epitaxial layer is laminated on at least one surface.

(7) The method of manufacturing a SiC substrate according to any one of (1) to (5) may further include a rough polishing process of polishing the surface of the SiC substrate in accordance with a mechanical polishing method before the oxide film-forming process.

In addition, in the invention, the "SiC substrate" is intended to include both a SiC substrate itself and a SiC substrate (SiC epitaxial wafer) in which an epitaxial layer is laminated on at least one surface. That is, in the invention, the term "a surface of a SiC substrate is polished to planarize the surface" is intended to include both a case of polishing a surface of the SiC substrate and a case of polishing a surface (epitaxial layer surface) of a SiC substrate (SiC epitaxial wafer) in which an epitaxial layer is laminated on a surface thereof.

Advantageous Effects of Invention

According to the method of manufacturing a SiC substrate of the invention, the following method is employed. That is, the oxide film is formed to cover the surface of the SiC substrate. Then, polishing is performed with respect to the SiC substrate from the oxide film side in accordance with the CMP method so as to remove the oxide film, and the surface of the SiC substrate is polished to planarize the surface. According to this, at an initial stage of the CMP polishing, scratches do not occur on the surface of the SiC substrate, and it is not necessary to add a process of removing the scratches due to the occurrence of the scratches, and thus it is possible to perform a process of planarizing the SiC substrate while greatly shortening a process time. As a result, it is possible to manufacture a SiC substrate having excellent surface properties with good productivity and yield ratio.

DESCRIPTION OF EMBODIMENTS

Figure 1:
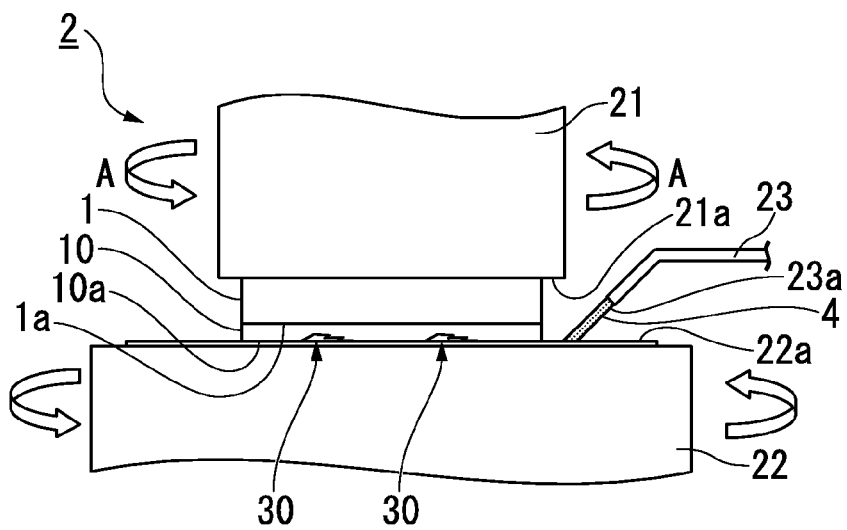
FIG. 1 is a view schematically illustrating a method of manufacturing a SiC substrate according to an embodiment of the invention, and is a schematic view illustrating an example of a process of polishing a surface of the SiC substrate by using a CMP method.

Hereinafter, a preferred example of a method of manufacturing a SiC substrate to which the invention is applied will be described in detail with reference to FIG. 1 to FIG. 5 in an appropriate manner.

In addition, in the drawings that are used in the following description, characteristic portions may be enlarged for convenience of easy understanding of characteristics, and dimensional ratios, and the like of respective constituent elements may be appropriately made different from those of actual values.

In addition, materials, dimensions, and the like which are exemplified in the following description are illustrative only, and the invention is not limited thereto, and appropriate modifications can be made in a range not changing the gist of the invention.

<SiC Substrate>

In the manufacturing method according to the invention, the SiC substrate that is an object to be polished is a semiconductor substrate that is used in various semiconductor devices. For example, the SiC substrate can be manufactured by grinding the outer periphery of an ingot of a SiC bulk single crystal prepared by a sublimation method and the like so as to process the ingot into a cylindrical shape, the ingot is sliced into a disk shape by using a wire saw and the like, and an outer peripheral portion of the sliced article is chamfered to be finished with a predetermined diameter. At this time, as the SiC bulk single crystal, an arbitrary polytype can be used, and 4H—SiC, which is mainly employed as a SiC bulk single crystal in the manufacturing of a practical SiC device, can be used.

A surface of the SiC substrate having a disk shape through the slicing process is finally mirror-polished. However, first, the surface may be polished by using a mechanical polishing method in the related art. From the mechanical polishing, unevenness on a polishing surface can be approximately removed, and a degree of parallelization can be adjusted. In addition, when the surface of the SiC substrate, of which the surface is polished by using the mechanical polishing method, is subjected to mechanochemical polishing in accordance with a chemical mechanical polishing (CMP) method, a SiC substrate of which the surface is mirror-finished is obtained. At this time, only one surface of the SiC substrate may be polished as a mirror surface, but both surfaces may be polished as a mirror surface.

When the surface of the SiC substrate is subjected to the polishing process, waviness or a process strain which occurs when the ingot is sliced is removed, and the surface of the substrate becomes a planarized mirror surface. The SiC substrate of which the surface is polished as a mirror surface has excellent flatness, and in a wafer obtained by forming various epitaxial layers on the SiC substrate, crystal characteristics of respective layers become excellent. Typically, an epitaxial layer serving as an active region of a SiC device is formed on the SiC substrate 1 by chemical vapor deposition (CVD) and the like, and the SiC substrate is used as a SiC epitaxial wafer.

In addition, as described above, the "SiC substrate" in the invention is intended to include both the SiC substrate itself, and a SiC substrate (SiC epitaxial wafer) in which an epitaxial layer is laminated on at least one surface. Accordingly, the polishing of the SiC substrate described in this embodiment is intended to include both a case of polishing a surface of the SiC substrate itself and a case of polishing a surface of the SiC substrate (SiC epitaxial wafer) in which the epitaxial layer is laminated on a surface, that is, the epitaxial layer surface.

In the case of polishing the surface of the SiC epitaxial wafer as described above, unevenness such as a minute step difference that occurs on a surface of the epitaxial layer during epitaxial growth is removed, and thus the surface is further planarized. Accordingly, when forming an electronic device, the quality of an interface with an oxide film that is formed on the surface is improved, and thus it is possible to obtain a device with high quality. Particularly, in a case where the epitaxial growth layer is thick, a step difference or the like tends to occur on a surface, and thus it is more preferable to employ conditions of CMP polishing in the manufacturing method of the invention. In addition, the surface of the epitaxial layer is flat in comparison to a SiC substrate that is sliced, and thus in a case of polishing the surface of the epitaxial layer with the CMP method, it is possible to omit surface polishing in accordance with the mechanical polishing method.

<Polishing Apparatus>

Hereinafter, description will be made with respect to an example of a polishing apparatus which is used in the method of manufacturing the SiC substrate that is described in this embodiment and is configured to perform a CMP polishing process.

Figure 2:
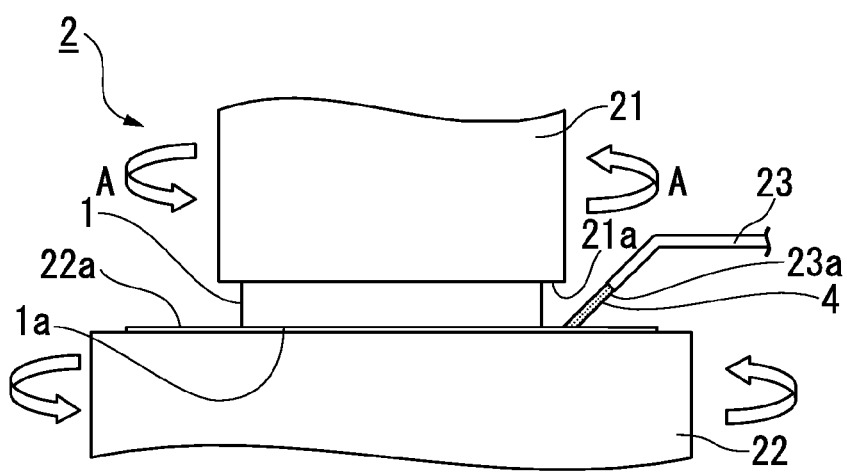
FIG. 2 is a view schematically illustrating the method of manufacturing the SiC substrate according to the embodiment of the invention, and is a schematic view illustrating the example of the process of polishing the surface of the SiC substrate by using the CMP method.

As illustrated in FIGS. 1 and 2, a polishing apparatus 2 of this embodiment schematically includes a SiC substrate-supporting portion 21 on which a SiC substrate 1 is mounted, a polishing pad 22a which is attached to a rotary platen 22 and polishes a surface 1a of the SiC substrate 1 when being pressed to the surface 1a while being rotated, and a slurry nozzle 23 configured to supply slurry 4 to an interface between the SiC substrate 1 and the polishing pad 22a.

The SiC substrate-supporting portion 21 has a cylindrical shape, and the SiC substrate 1 is mounted on a tip end surface 21a configured of a ceramic plate with a suctioning chuck mechanism (not shown) or the like. In addition, the SiC substrate-supporting portion 21 has a configuration capable of rotating in a predetermined direction (refer to an arrow A in FIG. 1) by a motor (not shown) or the like around a vertical axial direction. In addition, the SiC substrate-supporting portion 21 can be moved in a vertical direction in FIGS. 1 and 2 by a drive unit (not shown), and has a configuration capable of allowing the SiC substrate 1 that is suctioned to the tip end surface 21a to be pressed to the polishing pad 22 in accordance with downward movement of the SiC substrate-supporting portion 21. In addition, as a method of mounting the SiC substrate 1 to the tip end surface 21a of the SiC substrate-supporting portion 21, for example, a method of using a tape or wax can be employed without limitation to the suctioning chuck mechanism. In addition, the number of sheets of the SiC substrate 1 that is mounted to the tip end surface 21a may be one sheet, or a plurality of sheets may be mounted in parallel.

The polishing pad 22a is attached to the surface of the rotary platen 22 and polishes the surface 1a of the SiC substrate 1. As the polishing pad 22a, for example, nonwoven fabric, a suede material, and the like, which have been used in this field in the related art, can be used. In addition, as is the case with the SiC substrate-supporting portion 21, the polishing pad 22a has a configuration capable of rotating by a motor (not shown) or the like. While the polishing pad 22a itself is rotated and the SiC substrate 1 mounted to the SiC substrate-supporting portion 21 is rotated, the polishing pad 22a is pressed to the polishing pad 22a, and thus the surface of the SiC substrate 1 is polished and planarized.

As nonwoven fabric or a suede material that is used as the polishing pad 22a, for example, nonwoven fabric such as SUBA400 manufactured by Nitta Haas Incorporated can be used without any limitation.

The slurry nozzle 23 is configured to supply the slurry (polishing agent) 4 to the interface between the SiC substrate 1 and the polishing pad 22a, and slurry supplied to the slurry nozzle 23 from a slurry tank (not illustrated) by a pumping unit is ejected from a tip end opening 23a. In addition, in the example illustrated in FIGS. 1 and 2, the slurry 4 is supplied from the tip end opening 23a of the slurry nozzle 23 to an interface between an oxide film 10 that is formed on the surface 1a of the SiC substrate 1 and the polishing pad 22a.

Although details will be described later, in the manufacturing method of the invention, the polishing apparatus 2 having the above-described configuration is used, and a polishing surface 10a of the oxide film 10 formed on the surface 1a of the SiC substrate 1 is pressed to the polishing pad 22a while being rotated, and thus first, the oxide film 10 is polished from a polishing surface 10a side. In addition, when the oxide film 10 is almost completely removed during the polishing process, the surface 1a of the SiC substrate 1 below the oxide film 10 is exposed, but in the invention, the surface 1a of the SiC substrate 1 is polished subsequently to the polishing of the oxide film 10, and thus a planarization process of the SiC substrate 1 can be performed without the occurrence of scratches and the like on the surface 1a.

<Manufacturing Method>

The method of manufacturing the SiC substrate 1 according to the invention is a method of polishing the surface 1a of the SiC substrate 1 for planarization. In addition, in the invention, a surface of the SiC substrate in which an epitaxial layer (not shown) is laminated on at least one surface may be polished for planarization. In the following description, description will be made with respect to a case of polishing the surface 1a of the SiC substrate 1 on which the epitaxial layer is not laminated by using the polishing apparatus 2 having the above-described configuration as an example.

The manufacturing method according to the invention includes at least an oxide film-forming process of forming the oxide film 10 to cover the surface 1a of the SiC substrate 1, and a planarization process of polishing the SiC substrate 1 from an oxide film 10 side in accordance with a chemical mechanical polishing (CMP) method so as to remove the oxide film 10, and of polishing the surface 1a of the SiC substrate 1 to planarize the surface 1a. In addition, in the invention, a method including a rough polishing process of polishing the surface 1a of the SiC substrate 1 in accordance with a mechanical polishing method before the oxide film-forming process may be employed, and in the following description, a case of including the rough polishing process will be described as an example.

[Preparation of SiC Substrate]

In this embodiment, first, when obtaining the SiC substrate that is an object to be polished, an ingot of a SiC bulk single crystal is prepared, and the outer periphery of the ingot is ground to process the ingot in a cylindrical shape. Then, the ingot is sliced into a disk shape by using a wire saw and the like, and the outer periphery of the sliced article is chamfered to be finished as the SiC substrate 1 having a predetermined diameter.

In this embodiment, a method of growing the SiC bulk single crystal, a method of grinding the ingot, a method of slicing the ingot, and the like are not particularly limited, and methods which are known in the related art can be employed.

In addition, typically, a surface of the SiC substrate before performing grinding and polishing is in a state in which a variation, waviness, or unevenness in a thickness of approximately several tens micrometers occurs.

[Rough Polishing Process]

In a rough polishing process, the surface 1a of the SiC substrate 1 is polished in accordance with a mechanical polishing method.

Specifically, although not illustrated in detail, for example, a polishing process of removing unevenness such as relatively large waviness and process strain on the surface 1a of the SiC substrate 1 is performed by a mechanical polishing method such as lap polishing. At this time, it is possible to employ a method of lap-polishing one surface or both surfaces of the SiC substrate by using a lap polishing apparatus that is known in the related art. In the method, a SiC substrate is retained on a carrier plate, slurry is supplied, and a platen is rotated while moving the carrier plate in a planetary manner.

In the case of polishing both surfaces of the SiC substrate, first, the SiC substrate is accommodated and is retained in a circular hole formed in the carrier plate.

Next, the SiC substrate that is retained in the carrier plate is interposed between platens which are disposed on upper and lower sides thereof. In a state in which a load is applied, two sheets of platens are alternately rotated in opposite directions while supplying slurry including a polishing agent between the platens and the SiC substrate in order to grind a front surface and a rear surface of the SiC substrate. According to this, the surfaces of the SiC substrate are gradually polished, and convex portions of the waviness that remains on the surfaces are removed first. As an abrasive grain for processing, for example, a diamond abrasive grain or the like is used. In addition, in the case of polishing only one surface of the SiC substrate, a surface opposite to the surface of the SiC substrate to be polished is attached to the carrier plate with an adhesive or the like. The carrier plate to which the SiC substrate is attached and the platen are made to face each other, and then the same polishing as described above is performed.

The surface of the SiC substrate which is polished by the rough polishing process enters a state in which unevenness such as large waviness and a process strain is removed therefrom.

In the rough polishing process, a process pressure in the case of performing mechanical polishing with the lap polishing, that is, a load that is applied during polishing of the SiC substrate is preferably set to a range of 10 $g/cm^2$ to 100 $g/cm^2$. The process pressure corresponds to a polishing rate, but when the range thereof is set to the above-described range, it is possible to obtain a polishing rate at which the unevenness such as the waviness and the process strain on the surface of the SiC substrate can be removed in a short time. When the process pressure applied to the SiC substrate exceeds the above-described range, a force tends to be locally applied to a SiC substrate in which a deviation in thickness or the waviness is large after being sliced, and thus there is a possibility that a fracture, a crack, and the like will occur in the SiC substrate.

In addition, a particle size of the abrasive grain that is used at this time is preferably 10 µm or less.

In addition, in the rough polishing process described in this embodiment, the method of performing rough polishing with the lap polishing as described above is exemplified. However, it is possible to employ a method in which precise polishing is performed by using a polish after the lap polishing, and then the following oxide film-forming process and planarization process are performed to polish the surface 1a of the SiC substrate 1 with ultraprecision.

In addition, in the lap polishing, it is possible to perform precise polishing by using minute diamond slurry in which an average particle size of secondary particles is approximately 0.25 µm (250 nm) and which is also used in a polish.

In addition, the above-described rough polishing process may be performed plural times.

[Oxide Film-forming Process]

Next, in the oxide film-forming process, the oxide film 10 is formed to cover the surface 1a of the SiC substrate 1 from which relatively large waviness, process strain, and the like are removed in the rough polishing process of the above-described procedure.

Specifically, an oxide is deposited on the surface 1a of the SiC substrate 1 to cover the surface 1a by using a film-forming method in the related art so as to form the oxide film 10 illustrated in FIG. 1. According to this, minute unevenness, which remains on the surface 1a of the SiC substrate 1, also enters a state of being buried and covered with the oxide film 10.

The oxide film 10 is a film which serves as a protective film in the following planarization process and is completely removed.

Although not particularly limited, it is preferable to appropriately employ a material of the oxide film 10 in consideration of a processing rate of slurry (polishing agent) that is used in a CMP polishing process in a planarization process to be described later. For example, in a case of using colloidal silica, which is known in the related art, as the slurry, it is preferable to use a silicon oxide film ($SiO_2$ film), with which a processing rate ten or more times a processing rate of SiC is obtained, as the oxide film 10. In addition, it is also possible to employ an oxide film material other than $SiO_2$ in consideration of the following conditions of a film-forming rate or a processing rate by CMP polishing.

A film-forming rate when forming the oxide film 10 on the surface 1a of the SiC substrate 1 is preferably 0.15 (μm/hr) or greater from the viewpoint of a reduction in a processing (film forming) time and the like. When the film-forming rate of the oxide film is equal to or less than the above-described value, there is a concern that productivity may decrease.

In the oxide film-forming process, it is preferable to form the oxide film 10 in a film thickness of 0.5 μm or greater.

As described above, if the film thickness of the oxide film 10 is set to 0.5 μm or greater, the following effect is reliably obtained. Specifically, when the SiC substrate 1 is pressed to the polishing pad 22 while being rotated in the following planarization process, scratches 30 (refer to FIG. 1) occur in the oxide film 10 at an initial stage at which polishing is initiated, but it is possible to suppress the scratches 30 from reaching the SiC substrate 1. That is, the oxide film 10 functions as a protective film that suppresses occurrence of the scratches 30, which tend to occur at a polishing initial stage at which a polishing operation is not stable (stage at which rotation of the SiC substrate 1 illustrated in FIG. 1, rotation of the polishing pad 22, supply of the slurry 4 between the SiC substrate 1 and the polishing pad 22, and the like are not stable), on the surface 1a of the SiC substrate 1.

Although not particularly limited, as a method of forming the oxide film 10, in a case of forming the oxide film 10 through film formation of $SiO_2$, it is preferable to use, for example, a P-CVD method. The reason for this is as follows. According to the P-CVD method, a film-forming rate as high as approximately 5 (μm/hr) is obtained in accordance with film-forming conditions, or the P-CVD method is typically used in a process of manufacturing a device after formation of an epitaxial layer. Accordingly, there is merit that in a process of manufacturing a semiconductor device, it is possible to use a manufacturing apparatus as is.

In addition, for example, as a film-forming method other than the P-CVD method, in an RF sputtering method, the film-forming rate is approximately 0.2 (μm/hr) and is lower than the film-forming rate in the P-CVD method, but it is considered that the RF sputtering method is practical from the viewpoint of a processing (film forming) time.

In addition, in a case of employing a thermal oxide film, the saturated film thickness is 0.1 μm, and this thermal oxide film is too small as the oxide film that is used in the invention. Accordingly, there is a concern that scratches may occur on the SiC substrate during CMP polishing in the following planarization process. In addition, in the case of forming the thermal oxide film, the film-forming rate is as slow as 0.1 (μm/hr) or less, and thus it is difficult to expect an effect of shortening the processing time, and thus this case is not preferable.

In addition, it is possible to consider a case of using a silicon nitride film (SiN film) that is an insulating film instead of the oxide film 10 composed of $SiO_2$. However, in a case of using slurry (polishing solution) for polishing the insulating film in the following planarization process, a polishing rate of the silicon nitride film is several times smaller than the polishing rate of $SiO_2$, and thus this case is not preferable from the viewpoint of productivity.

In addition, when being formed in a large thickness, the silicon nitride film tends to be fractured, and thus the polishing rate of the silicon nitride film on the surface 1a of the SiC substrate 1 becomes irregular. Accordingly, this is not preferable.

[Planarization Process]

Next, in the planarization process, the unevenness and the degree of parallelization are adjusted in the planarization process, and the SiC substrate 1 in which the oxide film 10 is formed on the surface 1a is subjected to ultraprecision polishing (mirror polishing) from an oxide film 10 side in accordance with the CMP method. Through the ultraprecision polishing, the oxide film 10 is polished and removed, and the surface 1a of the SiC substrate 1 is polished, and thus the surface 1a is planarized.

Specifically, as illustrated in FIG. 1, first, the SiC substrate 1 on which the oxide film 10 is laminated on the surface 1a is suctioned and fixed to the tip end surface 21a of the SiC substrate-supporting portion 21 provided to the polishing apparatus 2 by using a suction chuck mechanism (not illustrated) or a bonding method using a tape or wax in a state in which the oxide film 10 side is exposed and faces the polishing pad 22.

Then, the slurry (polishing solution) 4 is supplied to the polishing pad 22a from the slurry nozzle 23 in a state in which the polishing pad 22a is rotated in a predetermined number of revolutions. In addition, the SiC substrate-supporting portion 21 to which the SiC substrate 1 is mounted is moved in a downward direction, and the polishing surface 10a of the oxide film 10 and the polishing pad 22a are brought into contact with each other. The SiC substrate-supporting portion 21 is rotated in a predetermined number of revolutions to initiate polishing of the oxide film 10.

At this time, at an initial polishing stage, scratches 30, which are caused by the polishing agent (for example, colloidal silica in which an average particle size of secondary particles is 0.2 μm to 0.5 μm) included in the slurry 4, occur on the polishing surface 10a of the oxide film 10 having a thickness of 0.5 μm or greater due to an operation of pressing the SiC substrate 1 (oxide film 10) to the rotating polishing pad 22a, an operation of initiating rotation of the SiC substrate-supporting portion 21, and the like. The scratches 30 tend to occur immediately after initiation of the CMP polishing, and are less likely to newly occur when polishing progresses and the CMP polishing becomes stable.

In the invention, after the oxide film 10 is polished, the SiC substrate 1 is polished in a state in which polishing becomes stable (a state in which rotation of the polishing fabric, rotation of the SiC substrate, supply of the slurry 4 between the SiC substrate and the polishing fabric, and the like become stable, and scratches are less likely to occur due to a reduction in friction which occurs due to the hydroplane phenomenon). According to this, the scratches 30 occur only on the oxide film 10 that is formed on the surface 1a of the SiC substrate 1, and the scratches 30 do not reach the SiC substrate 1. Accordingly, it is possible to suppress occurrence of the scratches on the surface 1a of the SiC substrate 1. In addition, the oxide film 10 is removed in the planarization process, and thus even when the scratches 30 occur on the oxide film 10, there is no problem.

Then, as illustrated in FIG. 2, the oxide film 10 is removed by polishing and removal of the oxide film 10, and thus polishing of the surface 1a of the SiC substrate 1 which is exposed due to the removal of the oxide film 10 is continuously performed. At this stage, the pressure at which the SiC substrate 1 is pressed to the polishing pad 22a or the number of revolutions of each of the SiC substrate 1 and the polishing pad 22a already have become stable, and thus scratches do not occur on the SiC substrate. According to this, minute unevenness and the like which remain on the surface 1a of the SiC substrate 1 are planarized, and thus the surface 1a is mirror-polished.

With regard to the processing rate (polishing rate) of the SiC substrate 1 at this time, the SiC substrate 1 can be polished under a CMP condition that is slower than the processing rate of the oxide film 10 composed of the silicon oxide film. According to this, the minute unevenness on the surface 1a of the SiC substrate 1 can be selectively polished, and thus it is possible to process the surface 1a of the SiC substrate 1 into a satisfactory flat surface. Unevenness such as relatively large waviness and process strain is removed from the surface 1a of the SiC substrate 1 in the rough polishing process, and thus only minute unevenness and the like remain on the surface 1a. Accordingly, even in the case of using slurry (polishing solution with which the SiC substrate 1 is less likely to be polished) in which a ratio of the processing rate of the SiC substrate 1 to the processing rate of the oxide film 10 is low, it is possible to planarize and mirror-polish the surface 1a of the SiC substrate 1 in a relatively short time. In addition, in the case of CMP-polishing the surface of the epitaxial layer, the size of unevenness before polishing is small, and planarization is performed in a small processing amount, and thus the above-described CMP condition is particularly preferable.

In the planarization process described in this embodiment, in a case where the diameter of the SiC substrate 1 is four inches (10.16 cm), for example, polishing conditions may be set as follows. That is, the number of revolutions of the polishing pad 22 may be set to 30 to 70 rpm, the number of revolutions of the SiC substrate-supporting portion 21 may be set to 30 rpm to 70 rpm, and the processing pressure (polishing load) may be set to 100 g/cm$^2$ to 1000 g/cm$^2$.

The slurry (polishing agent) 4 that is used in the planarization process is not particularly limited. However, when processing the oxide film 10 and the surface 1a of the SiC substrate 1 in accordance with the CMP method, it is preferable that a ratio of the processing rate of the oxide film 10 to the processing rate of the SiC substrate 1 be 10 to 1 or greater. In addition, in addition to the ratio between the processing rates, the processing rate of the SiC substrate 1 is more preferably 0.1 (μm/hr) or greater.

In addition, in this embodiment, "ratio of the processing rate of the oxide film 10 to the processing rate of the SiC substrate 1 is 10 to 1 or greater" represents that a ratio of the processing (polishing) rate of the oxide film 10 is 10 to 1 or greater times the processing rate of the SiC substrate 1. In addition, "ratio of the processing rate of the oxide film 10 to the processing rate of the SiC substrate 1 is high" represents that the processing rate of the oxide film 10 is greater than the processing rate of the SiC substrate 1.

As described above, when using the slurry 4 in which the ratio of the processing rate of the oxide film 10 to the processing rate the SiC substrate 1 is 10 to 1 or greater, and the ratio of the processing rate of the oxide film 10 to the processing rate of the SiC substrate 1 is high (for example, SiC:SiO$_2$=1:100), it is possible to shorten the time required to polish and remove the oxide film 10, and thus productivity of the SiC substrate 1 can be improved.

In addition, when using the slurry 4 in which the ratio of the processing rate of the oxide film 10 to the processing rate of the SiC substrate 1 is 10 to 1 or greater, and the ratio of the processing rate of the oxide film 10 to the processing rate of the SiC substrate 1 is high, it is possible to reduce a polishing amount (polishing margin) of the SiC substrate 1 as much as possible, and thus it is possible to obtain the flat surface 1a on which scratches do not occur without lengthening the process time. In addition, in the case of polishing the surface of the epitaxial layer, it is possible to obtain a flat surface in the epitaxial layer without the occurrence of scratches.

In addition, as the slurry 4, for example, it is possible to use slurry in which an average particle size of secondary particles, which are generated agglomeration of the polishing agent in the slurry 4, is 0.2 μm to 0.5 μm.

As described above, first, in the oxide film-forming process, the oxide film 10 having a film thickness of 0.5 μm or greater is formed. Then, the oxide film 10 is polished by using the slurry 4 in which the average particle size of the secondary particles of the polishing agent is in the above-described range, and thus the scratches 30 which tend to occur at the initial polishing stage (a stage at which the rotating polishing pad 22a and the polishing surface 10a of the oxide film 10 come into contact with each other and polishing is initiated) due to the polishing agent can be suppressed from reaching the surface 1a of the SiC substrate 1.

As a specific example of the slurry 4, it is possible to use a mixed solution which is obtained by mixing colloidal silica in which the average particle size of secondary particles is 0.2 μm to 0.5 μm, KOH, H$_2$O$_2$, pure water, and the like, and in which PH has alkalinity (for example, PH is 11 or less).

In addition, mixing of KOH and H$_2$O$_2$ may be adjusted so as to raise the ratio of the processing rate of the oxide film 10 to the processing rate of the SiC substrate 1.

In addition, when the ratio of the processing rate of the oxide film 10 to the processing rate of the SiC substrate 1 is equal to or greater than the above-described value, and in addition to this, when the processing rate of the SiC substrate 1 is 0.1 (μm/hr) or greater, it is possible to polish the surface 1a of the SiC substrate 1 in a short time, and thus productivity is improved.

Then, in the planarization process, the polishing operation is stopped at a stage in which the surface 1a of the SiC substrate 1 is planarized and is mirror-polished. Specifically, the SiC substrate-supporting portion 21 is moved to an upper side to be spaced away from the polishing pad 22a.

Then, the SiC substrate-supporting portion 21 and the surface 1a of the SiC substrate 1 are washed with pure water while rotating the SiC substrate-supporting portion 21.

Figure 3:
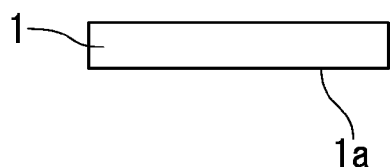
FIG. 3 is a view schematically illustrating the method of manufacturing the SiC substrate according to the embodiment of the invention, and is a cross-sectional view illustrating the SiC substrate after the polishing by the CMP method.

Then, as illustrated in FIG. 3, the SiC substrate 1 is detached from the SiC substrate-supporting portion 21, and the entirety of the SiC substrate 1 is washed with a chemical solution that is known in the related art to remove the slurry 4 that is attached to the SiC substrate 1, and then the SiC substrate 1 is dried.

From the above-described processes, it is possible to manufacture the SiC substrate 1 in which the surface 1a is planarized and mirror-polished.

In addition, various epitaxial layers may be grown on the planarized surface 1a of the SiC substrate 1 by using a CVD method that is known in the related art to form a semiconductor device. In the invention, the surface of the device on which the epitaxial layers and the like are formed can be polished by the same method as described above.

In addition, commonly, the depth of the scratches which occur on the surface of the SiC substrate in the CMP polishing process is approximately 0.5 μm or less. Accordingly, when the oxide film 10 is formed in a film thickness of 0.5 μm or greater in the oxide film-forming process before the planarization process using the CMP polishing, since the scratches 30 which occur at the initial polishing stage do not reach the surface 1a of the SiC substrate 1, it is possible to suppress occurrence of the scratches on the SiC substrate 1. In addition, post-processing, which is necessary to remove the scratches on the substrate surface in the CMP polishing process of the related art, can be omitted, and thus it is possible to shorten the process time of approximately 15 minutes which is necessary for the post-processing.

As described above, so as to shorten the processing time in comparison to the CMP polishing process in the related art, it is necessary for the total of the film-forming time required to form the oxide film 10 in a film thickness of 0.5 μm or greater in the oxide film-forming process and the processing time required to polish and remove the oxide film 10 in the planarization process to be approximately 4 hours or less. On the other hand, it is preferable that polishing conditions during polishing and removal of the oxide film 10 in the planarization process be the same as the conditions during polishing of the SiC substrate 1 instead of the optimal polishing conditions in the case of polishing the oxide film from the viewpoint of process continuity, and thus the polishing time of the oxide film 10 depends on the polishing conditions of the SiC substrate 1.

According to this, it is necessary that the slurry 4 can process both of the oxide film 10 and the SiC substrate 1, and the processing rate of the oxide film 10 is higher. For example, in a case of a $SiO_2$ film, as the polishing agent, when using a polishing agent including colloidal silica or alumina, a processing rate ($SiO_2$ processing rate), which is 10 or greater times a processing rate of SiC, is obtained. Particularly, in a case of using colloidal silica based slurry 4, when the slurry 4 is set to have alkalinity, it is possible to raise the processing rate of the $SiO_2$ up to approximately 100 times the processing rate of SiC without practical change to the processing rate of SiC, and thus this leads to shortening of the processing time of the oxide film 10.

Hereinafter, an experimental example performed by the present inventors to verify the method of manufacturing the SiC substrate of the invention will be described.

In the experiment, CMP polishing was performed with respect to a SiC substrate, which was roughly polished with lap polishing by using diamond slurry having an average particle size of 0.25 μm, under the following conditions. In addition, surface roughness Ra (nm) of the SiC substrate after the CMP polishing was measured by atomic force microscopy (AFM) in a visual field of 5 μm square, and the number of scratches that occurred on the surface of the SiC substrate was counted with confocal type microscope measurement. In addition, a relationship between the CMP processing time (hr) and the surface roughness Ra (nm) is illustrated in a graph in FIG. 4, and a relationship between the CMP processing time and the number of scratches is illustrated in a graph in FIG. 5.

Figure 4:
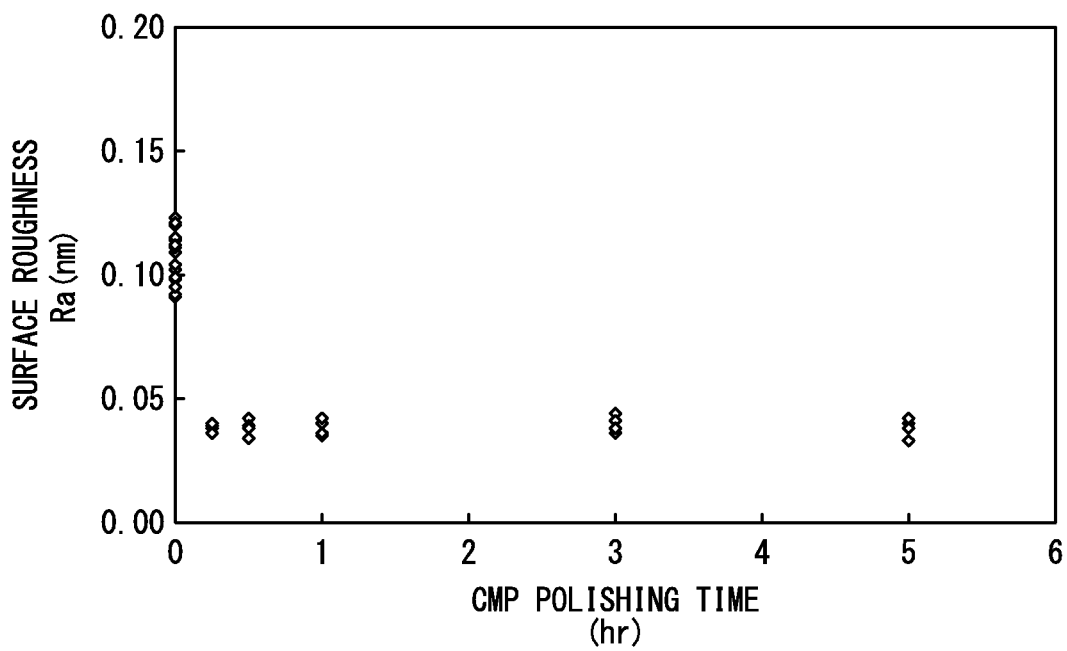
FIG. 4 is a view schematically illustrating the method of manufacturing the SiC substrate according to the embodiment of the invention, and is a graph illustrating a relationship between polishing time according to the CMP method and surface roughness Ra.
Figure 5:
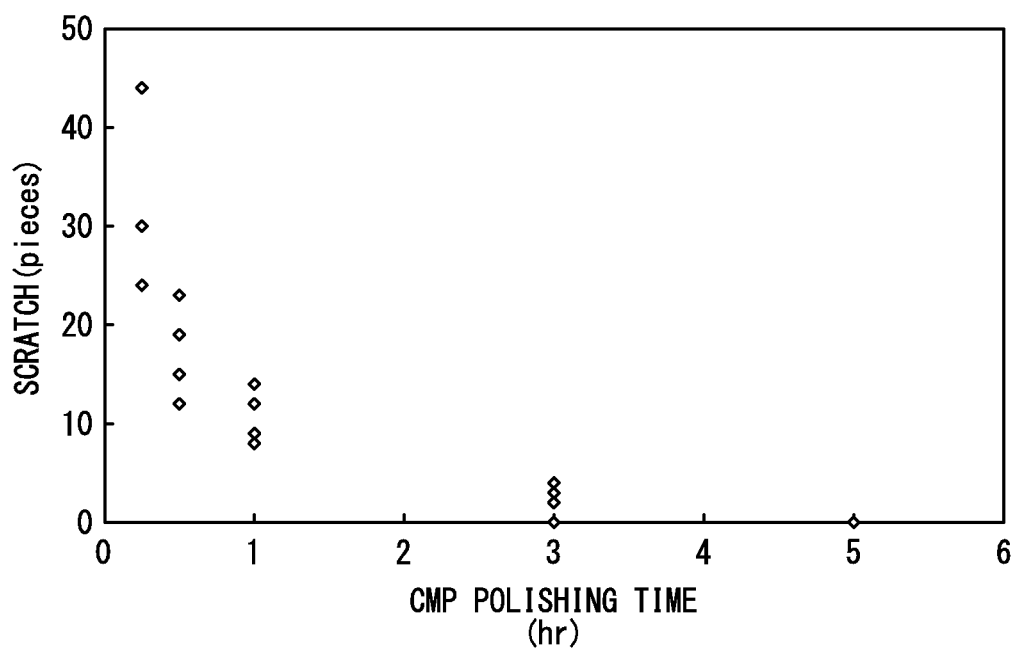
FIG. 5 is a view schematically illustrating the method of manufacturing the SiC substrate according to the embodiment of the invention, and is a graph illustrating a relationship between the polishing time according to the CMP method and the number of scratches on the surface of the SiC substrate.
Figure 6:
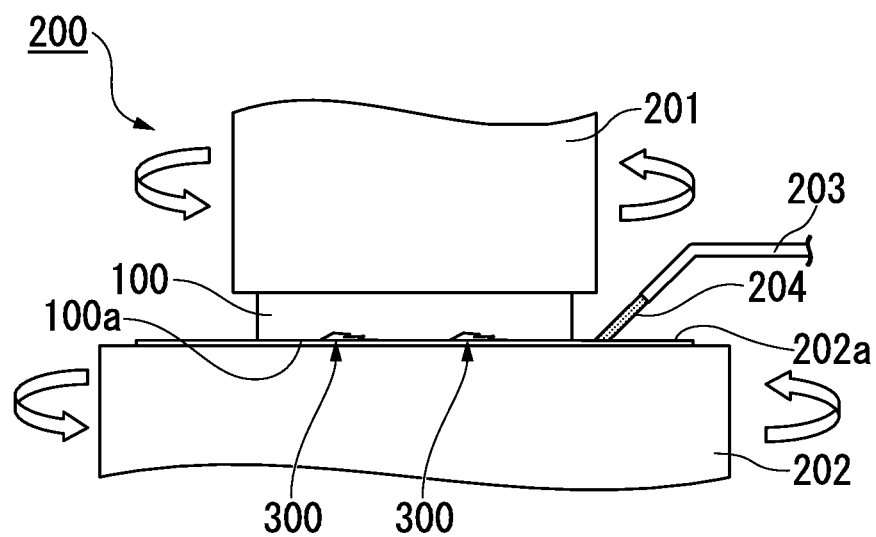
FIG. 6 is a view schematically illustrating a method of manufacturing a SiC substrate in the related art.
Figure 7:
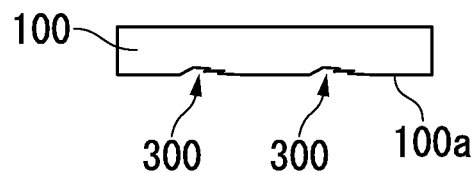
FIG. 7 is a view schematically illustrating the method of manufacturing the SiC substrate in the related art, and is a cross-sectional view illustrating the SiC substrate on which scratches occur due to polishing according to a CMP method using the method in the related art.

In addition, with regard to the CMP processing time illustrated in the graphs in FIGS. 4 and 5, an experiment was performed with a continuous operation in consideration of the occurrence of the scratches at an initial processing stage.

(1) SiC substrate (sample): 3 inches, 4H—SiC-4° off substrate; a set of four sheets (2) CMP polishing conditions A. processing time: 15 minutes, 30 minutes, 1 hour, 3 hours, and 5 hours; for each set B. CMP slurry: colloidal silica+KOH+$H_2O_2$ (pH: 9)

C. CMP polishing load: 300 gf/cm$^2$

D. The number of revolutions of a platen: 60 rpm (3) Measurement Conditions

A. AFM measurement: measurement is performed before and after CMP polishing

B. Confocal type microscope: counting is performed only after polishing (evaluation is impossible before the polishing due to noise caused by surface roughness)

As illustrated in the graph of FIG. 4, the surface roughness Ra of the SiC substrate before the polishing (0 hr) is 0.09 (nm) to 0.125 (nm). In contrast, the surface roughness Ra is approximately 0.04 (nm) after the passage of 15 minutes from the initiation of the CMP polishing. From the results, it can be seen that the planarization (mirror surface processing) of the substrate surface, which is the original object of the CMP polishing, is accomplished.

In addition, as illustrated in the graph in FIG. 5, it can be seen that the number of scratches is reduced with the passage of the CMP polishing time, and the scratches nearly disappear after 5 hr.

Here, the processing rate with the CMP is significantly low, and thus it is difficult to directly obtain the processing rate based on the variation in thickness of the SiC substrate. However, when calculating the processing rate based on the variation in weight of the substrate, it can be seen that the processing rate is approximately 0.1 (μm/hr), and a polishing amount of approximately 0.5 (m) is necessary to completely remove the scratches. From this, it can also be seen that when the film thickness of the oxide film 10, which is formed in the oxide film-forming process before the planarization process, is set to 0.5 (μm) or greater, it is possible to effectively suppress the scratches from reaching the surface of the SiC substrate, and thus the setting is more preferable.

<Operational Effect>

According to the method of manufacturing the SiC substrate of the invention, the following method is employed. Specifically, after forming the oxide film 10 to cover the surface 1a of the SiC substrate 1, polishing is performed with respect to the SiC substrate 1 from an oxide film 10 side in accordance with the CMP method in order to remove the oxide film 10, and the surface 1a of the SiC substrate 1 is polished so as to planarize the surface 1a. As described above, first, the oxide film 10 is formed to cover the surface 1a of the SiC substrate 1, and thus when the surface 1a of the SiC substrate 1 is subsequently polished in accordance with the CMP method, the oxide film 10 serves as a protective film. According to this, even in a case where the scratches 30 occur on the oxide film 10 at an initial CMP polishing stage at which the rotating polishing pad 22a and oxide film 10 are brought into contact with each other, it is possible to suppress the scratches 30 from reaching the surface 1a of the SiC substrate 1. Accordingly, the scratches do not occur on the surface 1a of the SiC substrate 1, and it is not necessary to add a process of removing the scratches due to occurrence of the scratches, and thus it is possible to planarize the SiC substrate while greatly shortening the process time. As a result, it is possible to manufacture the SiC substrate 1 excellent in surface properties with good productivity and yield ratio.

In addition, in a case of using the slurry 4 in which the ratio of the processing rate of the oxide film 10 to the processing rate of the SiC substrate 1 is 10 to 1 or greater, and the ratio of the processing rate of the oxide film 10 to the processing rate of the SiC substrate 1 is high, it is possible to remove the oxide film 10 in a short time, and planarization and mirror polishing can be performed in a state in which a polishing amount of the SiC substrate 1 is very small. Accordingly, it is possible to obtain the flat surface 1a on which the scratches do not occur without lengthening the process time. In addition, in the case of polishing the surface of the epitaxial layer, it is possible to obtain a flat surface in the epitaxial layer without the occurrence of the scratches.

Hereinbefore, a preferred embodiment of the invention has been described in detail. However, the invention is not limited to the specific embodiment, and various modifications and changes can be made in a range of the gist of the invention described in claims.

EXAMPLES

Hereinafter, an effect of the invention will be described in detail with reference to examples. In addition, the invention is not limited to the examples.

In the examples, examination of relationships between the film thickness of the oxide film and the CMP polishing time, and the number of scratches after polishing (Example 1), a relationship between the CMP polishing time and the number of scratches after polishing in a method of forming various oxides (Example 2), and a relationship between the CMP slurry and a CMP polishing amount (removal amount) (Example 3) were examined, respectively.

Example 1

In Example 1, first, lap type polishing was performed with respect to a surface of the SiC substrate (three inches, 4H—SiC-4° off substrate) by using diamond slurry in which an average particle size of secondary particles was 0.25 µm, and then a $SiO_2$ film was formed on the surface with a P-CVD method in each film thickness of 0.5 (µm), 1.0 (µm), and 2.0 (µm). Three sets of four sheets obtained for each film thickness were set as Present Examples 1-1-1 to 1-1-4, 1-2-1 to 1-2-4, and 1-3-1 to 1-3-4, respectively.

P-CVD conditions during formation of the $SiO_2$ film were set as follows.

(1) Pressure inside a chamber; 100 (Pa)
(2) Temperature inside the chamber; 400° C.
(3) Flow gas; $SiH_4:N_2O$=20:300 (sccm)
(4) RF power; 100 (W)
(5) Film-forming rate; 6 (µm/hr)

Then, CMP polishing was performed for 0.5 hr with respect to each of the substrates by using slurry which was obtained by adding KOH and $H_2O_2$ to colloidal silica in which an average particle size of secondary particles was 0.3 (µm) so as to adjust pH to 10.

The CMP polishing conditions were set as follows.

(1) Polishing load; 500 ($gf/cm^2$)
(2) The number of revolutions of a platen; 60 rpm
(3) Processing rate of the SiC substrate; 0.1 (µm/hr) {in terms of weight from density: 3.2 (g/cc)}

In addition, as Comparative Examples 1-1-1 to 1-1-4, 1-2-1 to 1-2-4, and 1-3-1 to 1-3-4, three sets of four sheets of SiC substrates in which the $SiO_2$ film was not formed after the lap type polishing by using the diamond slurry were subjected to the CMP polishing under the same processing conditions as Present Examples. The processing time at this time was set to 0.5 hr, and 3.5 hr, respectively.

In addition, with regard to Reference Examples 1-4-1 to 1-4-4, the $SiO_2$ film was formed on the surface of each SiC substrate in a film thickness of 0.3 (µm) under the same P-CVD conditions as in Present Examples, and then the CMP polishing was performed for 0.5 hr.

In addition, as evaluation of the SiC substrate after the CMP polishing, examination of the scratches was performed with respect to the entire surface of the SiC substrate by using a confocal type microscope (the number of the scratches was counted), and measurement of the surface roughness Ra (nm) was performed with AFM measurement (visual field: 5 µm square).

In addition, a difference between the weight of the SiC substrate after the lap type polishing by using the diamond slurry, and the weight of the SiC substrate after the CMP polishing was obtained to calculate the removal amount (removal thickness) of the SiC substrate by the CMP polishing.

Lists of manufacturing conditions and evaluation results of Present Examples and Comparative Examples in Example 1 are shown in Table 1.

TABLE 1

| Sample | $SiO_2$ film thickness (µm) | $SiO_2$ film-forming time (hr) | CMP polishing hour (hr) | Scratches (pieces/SiC) | SiC surface roughness Ra (nm) | Removal mount by CMP polishing (µm/SiC) |
|---|---|---|---|---|---|---|
| Present Example 1-1-1 | 0.5 | 0.08 | 0.5 | 0 | 0.04 | 0.04 |
| Present Example 1-1-2 | | | | 0 | 0.03 | 0.04 |
| Present Example 1-1-3 | | | | 0 | 0.04 | 0.04 |
| Present Example 1-1-4 | | | | 0 | 0.04 | 0.05 |
| Present Example 1-2-1 | 1.0 | 0.17 | 0.5 | 0 | 0.04 | 0.04 |
| Present Example 1-2-2 | | | | 0 | 0.04 | 0.04 |
| Present Example 1-2-3 | | | | 0 | 0.04 | 0.03 |
| Present Example 1-2-4 | | | | 0 | 0.03 | 0.04 |
| Present Example 1-3-1 | 2.0 | 0.33 | 0.5 | 0 | 0.03 | 0.03 |
| Present Example 1-3-2 | | | | 0 | 0.04 | 0.04 |
| Present Example 1-3-3 | | | | 0 | 0.05 | 0.03 |
| Present Example 1-3-4 | | | | 0 | 0.04 | 0.03 |
| Comparative Example 1-1-1 | 0.0 | 0.00 | 0.5 | 3 | 0.04 | 0.05 |
| Comparative Example 1-1-2 | | | | 12 | 0.04 | 0.05 |
| Comparative Example 1-1-3 | | | | 4 | 0.04 | 0.06 |
| Comparative Example 1-1-4 | | | | 8 | 0.03 | 0.05 |
| Comparative Example 1-2-1 | 0.0 | 0.00 | 3 | 1 | 0.04 | 0.33 |

TABLE 1-continued

| Sample | SiO$_2$ film thickness (μm) | SiO$_2$ film-forming time (hr) | CMP polishing hour (hr) | Scratches (pieces/SiC) | SiC surface roughness Ra (nm) | Removal mount by CMP polishing (μm/SiC) |
|---|---|---|---|---|---|---|
| Comparative Example 1-2-2 | | | | 3 | 0.04 | 0.31 |
| Comparative Example 1-2-3 | | | | 3 | 0.04 | 0.29 |
| Comparative Example 1-2-4 | | | | 0 | 0.03 | 0.28 |
| Comparative Example 1-3-1 | 0.0 | 0.00 | 5 | 0 | 0.04 | 0.55 |
| Comparative Example 1-3-2 | | | | 0 | 0.04 | 0.52 |
| Comparative Example 1-3-3 | | | | 0 | 0.03 | 0.52 |
| Comparative Example 1-3-4 | | | | 0 | 0.04 | 0.51 |
| Reference Example 1-4-1 | 0.3 | 0.05 | 0.5 | 0 | 0.04 | 0.05 |
| Reference Example 1-4-2 | | | | 0 | 0.04 | 0.05 |
| Reference Example 1-4-3 | | | | 2 | 0.04 | 0.05 |
| Reference Example 1-4-4 | | | | 4 | 0.04 | 0.04 |

As shown in Table 1, it could be seen that in Present Examples which were subjected to the CMP polishing after forming the SiO$_2$ film (oxide film) on the surface of the SiC substrate under the conditions defined in the invention, scratches did not occur in all samples, and the surface roughness Ra was less than 0.1 (μm), and thus the samples were finished to have a flat and ideal mirror surface.

In contrast, in Comparative Examples 1-1-1 to 1-2-3 which were subjected to the CMP polishing without formation of the SiO$_2$ film on the surface of the SiC substrate, the scratches were detected, and thus it was difficult to polish the substrate surface into the ideal mirror surface.

In addition, in Comparative Example 1-2-4, occurrence of the scratches was not confirmed, but the CMP polishing time was long. Accordingly, the removal amount of the SiC substrate was large, and thus productivity was not high.

In addition, Comparative Examples 1-3-1 to 1-3-4 relate to a processing method in the related art, and scratches were not found. However, it could be seen that additional polishing was performed to remove the scratches which occurred at an initial CMP polishing stage, and thus the CMP polishing time was as long as 5 hours and productivity greatly deteriorated.

As described above, in all of Comparative Examples of Example 1, there were problems such as the scratches that occurred and the process time was lengthened.

On the other hand, in Present Examples, the total of the film-forming time of SiO$_2$ film and the CMP polishing time was in one hour, and even when some time was necessary for processing before and after formation of the SiO$_2$ film, it was apparent that the process time was greatly shortened in comparison to the method of the related art.

In addition, among Reference Examples, in Reference Examples 1-4-3 and 1-4-4, the film thickness of the SiO$_2$ film formed on the surface of the SiC substrate was 0.3 (μm), and was smaller than the film thickness in Present Examples. From this result, it was confirmed that scratches occurred on the surface of the SiC substrate. This is considered to be because the film thickness of the SiO$_2$ film was small, and thus scratches, which occurred in the SiO$_2$ film at an initial CMP polishing stage, reached the surface of the SiC substrate.

Example 2

In Example 2, lap type polishing was performed with respect to a surface of the SiC substrate (three inches, 4H—SiC-4° off substrate) by using diamond slurry in which an average particle size of secondary particles was 0.25 μm, and then a SiO$_2$ film was formed on the substrate surface under the same conditions as in Present Examples 1-1-1 to 1-1-4 of Example 1 in a film thickness of 0.5 (μm) by the P-CVD method. Respective SiC substrates obtained as described above were set as Present Examples 2-1-1 to 2-1-4.

In addition, the SiO$_2$ film was formed on the surface of the SiC substrates in a film thickness of 0.5 (μm) under the same conditions as in Present Example 2-1-1 except that an RF sputtering method was used instead of the P-CVD method, and respective SiC substrates obtained as described above were set as Present Examples 2-2-1 to 2-2-4.

RF sputtering conditions during formation of the SiO$_2$ film were as follows.

(1) Ar gas pressure; 0.8 (Pa)
(2) RF power; 100 (W)
(3) Target; φ180 mm (SiO$_2$)
(4) Film-forming rate; 0.2 (μm/hr)

In addition, a SiO$_2$ film was formed on the surface of the SiC substrates in a film thickness of 0.5 (μm) under the same conditions as in Present Examples 2-2-1 to 2-2-4 by the RF sputtering method except that the RF power was set to 200 (W), and the film-forming rate was set to 0.08 (μm/hr). Respective SiC substrates obtained as described above were set as Reference Examples 2-1-1 to 2-1-4.

Then, as is the case with Example 1, CMP polishing was performed for 0.5 hr with respect to each of the substrates by using slurry obtained by adding KOH and H$_2$O$_2$ to colloidal silica in which an average particle size of secondary particles was 0.3 (μm) so as to adjust pH to 10.

The CMP polishing conditions were set as follows.

(1) Polishing load; 500 (gf/cm$^2$)
(2) The number of revolutions of a platen; 60 rpm
(3) Processing rate of the SiC substrate; 0.1 (μm/hr) {in terms of weight from density: 3.2 (g/cc)}

In addition, as evaluation of the SiC substrate after the CMP polishing, examination of the scratches was performed with respect to the entire surface of the SiC substrate by using a confocal type microscope (the number of the scratches was counted), and measurement of the surface roughness Ra (nm) was performed with AFM measurement (visual field: 5 μm square).

In addition, a difference between the weight of the SiC substrate after the lap type polishing by using the diamond slurry, and the weight of the SiC substrate after the CMP polishing was obtained to calculate the removal amount (removal thickness) of the SiC substrate by the CMP polishing.

Lists of manufacturing conditions and evaluation results of Present Examples and Reference Examples in Example 2 are shown in Table 2.

TABLE 2

| Sample | SiO$_2$ film-forming method | SiO$_2$ film-forming rate (μm/hr) | SiO$_2$ film thickness (μm) | SiO$_2$ film-forming time (hr) | CMP polishing time (hr) | Scratches (pieces/SiC) | SiC surface roughness Ra (nm) | Removal amount by CMP polishing (mm/SiC) | Total processing time (hr) |
|---|---|---|---|---|---|---|---|---|---|
| Present Example 2-1-1 | P-CVD | 6 | 0.5 | 0.08 | 0.5 | 0 | 0.04 | 0.04 | 0.6 |
| Present Example 2-1-2 | | | | | | 0 | 0.04 | 0.05 | |
| Present Example 2-1-3 | | | | | | 0 | 0.03 | 0.05 | |
| Present Example 2-1-4 | | | | | | 0 | 0.04 | 0.05 | |
| Present Example 2-2-1 | RF-SPT | 0.2 | 0.5 | 2.5 | 0.5 | 0 | 0.03 | 0.05 | 3.0 |
| Present Example 2-2-2 | | | | | | 0 | 0.04 | 0.04 | |
| Present Example 2-2-3 | | | | | | 0 | 0.04 | 0.05 | |
| Present Example 2-2-4 | | | | | | 0 | 0.04 | 0.05 | |
| Reference Example 2-1-1 | RF-SPT | 0.08 | 0.5 | 6.3 | 0.5 | 0 | 0.04 | 0.04 | 6.8 |
| Reference Example 2-1-2 | | | | | | 0 | 0.04 | 0.05 | |
| Reference Example 2-1-3 | | | | | | 0 | 0.03 | 0.05 | |
| Reference Example 2-1-4 | | | | | | 0 | 0.04 | 0.05 | |

As shown in Table 2, it could be seen that in Present Examples which were subjected to the CMP polishing after forming the SiO$_2$ film (oxide film) on the surface of the SiC substrate under the conditions defined in the invention, scratches did not occur in all samples, and the surface roughness Ra was less than 0.1 (μm). In Present Examples, it could be seen that since the CMP polishing was performed after forming the SiO$_2$ film on the surface of the SiC substrate in a film thickness of 0.5 (μm), the samples were finished to have a flat and ideal mirror surface.

In contrast, in Reference Examples 2-1-1 to 2-1-4 in which the film-forming rate during formation of the SiO$_2$ film on the surface of the SiC substrate was set to 0.08 (μm), scratches were not found, the surface roughness Ra was less than 0.1 (μm), and thus surface properties were excellent. However, the total processing time of the film-forming time of the SiO$_2$ film and the CMP polishing time exceeded five hours, and thus the processing time was longer in comparison to the method in the related art.

From the results of Example 2, it could be seen that it was more preferable to set the film-forming rate of the SiO$_2$ film to 0.15 (μm) or greater so as to make the surface of the SiC substrate be a flat and ideal mirror surface, and so as to raise productivity by shortening the processing time.

Example 3

In Example 3, lap type polishing was performed with respect to a surface of the SiC substrate (three inches, 4H—SiC-4° off substrate) by using diamond slurry in which an average particle size of secondary particles was 0.25 μm, and then a SiO$_2$ film was formed on the substrate surface under the same conditions as in Present Examples 1-1-1 to 1-1-4 of Example 1 in a film thickness of 0.5 (μm) by the P-CVD method. Respective SiC substrates obtained as described above were set as Present Examples 3-1-1 to 3-1-4, and Present Examples 3-2-1 to 3-2-4.

Then, as is the case with Example 1, CMP polishing was performed for 0.5 hr with respect to each of the substrates by using two kinds of slurry which were obtained by adding KOH and H$_2$O$_2$ to colloidal silica in which an average particle size of secondary particles was 0.3 (μm) so as to adjust pH to 10 and 12, respectively.

The CMP polishing conditions were set as follows.
(1) Polishing load; 500 (gf/cm$^2$)
(2) The number of revolutions of a platen; 60 rpm
(3) Processing rate of the SiC substrate; {in terms of weight from density: 3.2 (g/cc)}
In a case where pH was 10; 0.1 (μm/hr)
In a case where pH was 12; 0.13 (μm/hr)
(4) Processing rate of SiO$_2$ film; 10 (μm/hr) {in both pH of 10 and pH of 12}

In addition, lap type polishing was performed with respect to the surface of the SiC substrate by using the diamond slurry under the same conditions as in Present Examples, and then a SiO$_2$ film was formed on the substrate surface in a film thickness of 0.5 (μm) by the P-CVD method. SiC substrates which were obtained as described above were set as Reference Examples 3-1-1 to 3-1-4.

In addition, the CMP polishing was performed with respect to the surface of the SiC substrate for 0.5 hr under the same conditions as in Present Examples except that as the slurry, which was obtained by adding a pH adjusting agent and H$_2$O$_2$ to colloidal silica in which an average particle size of secondary particles was 0.3 (μm) so as to adjust pH to 2, was used.

At this time, the processing rate of the SiC substrate was 0.15 (μm/hr) in terms of weight from density: 3.2 (g/cc).

In addition, the processing rate of the SiO$_2$ film was 1.2 (μm/hr).

In addition, as evaluation of the SiC substrate after the CMP polishing, examination of the scratches was performed with respect to the entire surface of the SiC substrate by using a confocal type microscope (the number of the scratches was counted), and measurement of the surface roughness Ra (nm) was performed with AFM measurement (visual field: 5 μm square).

In addition, a difference between the weight of the SiC substrate after the lap type polishing by using the diamond slurry, and the weight of the SiC substrate after the CMP polishing was obtained to calculate the removal amount (removal thickness) of the SiC substrate by the CMP polishing.

Lists of manufacturing conditions and evaluation results of Present Examples and Reference Examples in Example 3 are shown in Table 3.

TABLE 3

| Sample | SiO₂ film thickness (μm) | pH of slurry (—) | CMP polishing rate of SiO₂ (μm/hr) | CMP polishing rate of SiC (μm/hr) | CMP polishing time (hr) | Scratches (pieces/SiC) | SiC surface roughness Ra (nm) | Removal amount by CMP polishing (μm/SiC) |
|---|---|---|---|---|---|---|---|---|
| Present Example 3-1-1 | 0.5 | 10 | 10 | 0.10 | 0.5 | 0 | 0.03 | 0.05 |
| Present Example 3-1-2 | | | | | | 0 | 0.04 | 0.05 |
| Present Example 3-1-3 | | | | | | 0 | 0.04 | 0.04 |
| Present Example 3-1-4 | | | | | | 0 | 0.04 | 0.05 |
| Present Example 3-2-1 | 0.5 | 12 | 10 | 0.13 | 0.5 | 0 | 0.04 | 0.06 |
| Present Example 3-2-2 | | | | | | 0 | 0.04 | 0.07 |
| Present Example 3-2-3 | | | | | | 0 | 0.03 | 0.06 |
| Present Example 3-2-4 | | | | | | 0 | 0.04 | 0.06 |
| Reference Example 3-1-1 | 0.5 | 2 | 1.2 | 0.15 | 0.5 | Evaluation was difficult | 0.11 | 0.01 |
| Reference Example 3-1-2 | | | | | | Evaluation was difficult | 0.09 | 0.01 |
| Reference Example 3-1-3 | | | | | | Evaluation was difficult | 0.06 | 0.02 |
| Reference Example 3-1-4 | | | | | | Evaluation was difficult | 0.07 | 0.01 |

As shown in Table 3, it could be seen that in Present Examples which were subjected to the CMP polishing after forming the SiO₂ film (oxide film) on the surface of the SiC substrate under the conditions defined in the invention, scratches did not occur in all samples, and the surface roughness Ra was less than 0.1 (μm), and thus the samples were finished to have a flat and ideal mirror surface.

In contrast, in Reference Examples 3-1-1 to 3-1-4 in which the film-forming rate during formation of the SiO₂ film on the surface of the SiC substrate was set to 1.2 (μm), and the slurry was prepared with pH of 2, the surface roughness Ra was large, and it was difficult to evaluate the number of scratches due to a noise caused by a rough surface. This is considered to be because the processing rate of the SiO₂ film was low, and thus the polishing amount of the surface of the SiC substrate was not sufficient, and it was difficult to improve the surface roughness Ra.

From the results of Example 3, it could be seen that it was more preferable that the processing rate of the SiC substrate be high, and in addition to this, the process rate of the SiO₂ film be higher so as to make the surface of the SiC substrate be a flat and ideal mirror surface, and so as to raise productivity by shortening the processing time.

From the results of Examples described above, when the method of manufacturing the SiC substrate according to the invention is applied, scratches do not occur on the surface of the SiC substrate, and it is not necessary to add a process of removing the scratches. Accordingly, it is possible to planarize the SiC substrate while greatly shortening the process time. As a result, it is apparent that it is possible to manufacture a SiC substrate excellent in surface properties with good productivity and yield ratio.

INDUSTRIAL APPLICABILITY

In the method of manufacturing the SiC substrate according to the invention, it is possible to manufacture a SiC substrate having excellent surface properties with good productivity and yield ratio, and thus the method is appropriate for manufacturing of a SiC substrate that is used in a power device, a high-frequency device, a high-temperature operation device, and the like.

REFERENCE SIGNS LIST

1: SiC substrate
1a: Surface
10: Oxide film
10a: Polishing surface
30: Scratch
2: Manufacturing apparatus
21: SiC substrate-supporting portion
21a: Tip end surface
22: Rotary platen
22a: Polishing pad
23: Slurry nozzle
23a: Tip end opening
4: Slurry

The invention claimed is:

1. A method of manufacturing a SiC substrate which includes a process of polishing and planarizing a surface of the SiC substrate, the method comprising at least:
   an oxide film-forming process of forming an oxide film to cover the surface of the SiC substrate; and
   a planarization process of polishing the SiC substrate from an oxide film side in accordance with a chemical mechanical polishing (CMP) method so as to completely remove the oxide film, and of polishing the surface of the SiC substrate to planarize the surface, wherein
   in the oxide film-forming process, the oxide film is formed by a P-CVD method or a RF sputtering method and the oxide film is formed in a film thickness of 0.5 μm or greater.

2. The method of manufacturing a SiC substrate according to claim 1,
   wherein in the oxide film-forming process, when forming the oxide film on the surface of the SiC substrate, a film-forming rate is 0.15 (μm/hr) or greater.

3. The method of manufacturing a SiC substrate according to claim 1,
   wherein in the planarization process, when polishing the oxide film and the SiC substrate in accordance with the CMP method, a polishing rate of the oxide film is greater than a polishing rate of the SiC substrate.

4. The method of manufacturing a SiC substrate according to claim 3,
   wherein in the planarization process, when polishing the oxide film and the SiC substrate in accordance with the CMP method, a ratio of the polishing rate of the oxide film with respect to the polishing rate of the SiC substrate is 10 to 1 or greater, and the polishing rate of the SiC substrate is 0.1 (μm/hr) or greater.

5. The method of manufacturing a SiC substrate according to claim 1,
   wherein the SiC substrate is a SiC substrate in which an epitaxial layer is laminated on at least one surface.

6. The method of manufacturing a SiC substrate according to claim 1, further comprising:
a rough polishing process of polishing the surface of the SiC substrate in accordance with a mechanical polishing method before the oxide film-forming process.

* * * * *